United States Patent
Liu et al.

(10) Patent No.: US 8,072,244 B1
(45) Date of Patent: Dec. 6, 2011

(54) CURRENT SENSING AMPLIFIER AND METHOD THEREOF

(75) Inventors: Chia-Chi Liu, Hsinchu (TW);
Shin-Jang Shen, Hsinchu (TW);
Meng-Fan Chang, Taichung (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 12/872,004

(22) Filed: Aug. 31, 2010

(51) Int. Cl.
*G01R 19/00* (2006.01)
(52) U.S. Cl. ............................................ 327/51; 327/57
(58) Field of Classification Search .................. None
See application file for complete search history.

(56) References Cited

U.S. PATENT DOCUMENTS

| | | | | |
|---|---|---|---|---|
| 3,849,673 A | * | 11/1974 | Koo .................................. | 327/57 |
| 4,802,130 A | * | 1/1989 | Soneda ........................... | 365/205 |
| 4,858,195 A | * | 8/1989 | Soneda ........................... | 365/205 |
| 5,017,805 A | * | 5/1991 | Kase ................................ | 327/88 |
| 6,750,704 B1 | * | 6/2004 | Connell et al. ..................... | 330/9 |
| 7,091,750 B2 | * | 8/2006 | Shionoiri et al. ................ | 327/51 |

* cited by examiner

*Primary Examiner* — Tuan Lam
(74) *Attorney, Agent, or Firm* — WPAT, P.C.; Anthony King

(57) ABSTRACT

The present invention relates to a current sensing amplifier and a method thereof. The current sensing amplifier comprises a first current path, a second current path, a first capacitor, a second capacitor and a latch circuit. When a first current and a second current flow in the first current path and the second current path respectively, the first and second capacitor may be charged by the first current and the second current. The first capacitor and the second capacitor may couple the charged voltage to the transistors in the first current path and the second current path when the first and second current path are cut off so as to cancel the effect of offset voltage of the transistors generated during the manufacturing process.

12 Claims, 3 Drawing Sheets

CURRENT SENSING AMPLIFIER AND METHOD THEREOF

BACKGROUND OF THE INVENTION

1. Field of the Invention

The exemplary embodiment(s) of the present invention relates to a current sensing amplifier and method thereof. More specifically, the exemplary embodiment(s) of the present invention relates to a current sensing amplifier and method thereof capable of canceling the offset voltage effect.

2. Description of Related Art

In the technical field of non-volatile memory, the data stored in the memory is read by applying current source or voltage source to the specific memory unit to generate a sensing current by transistors and to determine the logic state of such date stored in the memory by reading the sensing current.

With the evolution of semi-conductor manufacturing technology, the high-volume memory is provided by increasing the memory unit numbers on unit area. However, the offset effect due to transistor threshold voltage(Vth) may cause the result of logic state error reading owing to the random doping in the semi-conductor manufacturing process and the reducing manufacturing scale.

For the purpose of canceling the threshold voltage offset voltage, a high speed comparator with offset cancellation is disclosed by Edward Wai in US patent with U.S. Pat. No. 5,032,744. In the patent, two capacitors are used to block all DC voltage during a reset phase and a differential amplifier is driven into saturation during a regeneration phase so as to cancel the offset effect. However, the logic data determination speed may be decreased because of the charging and discharging time of the two capacitors are required.

Sensing amplifier with offset cancellation and charge-share limited swing drivers is disclosed by Esin Terzioglu due to the same purpose in US patent with U.S. Pat. No. 6,781,421. In the patent, different threshold voltage offset of different transistors are stored in a capacitor. When the data logic state is determined, the stored threshold voltage offset is added to correct the determining result. The capacitor also need to go through the charging and discharging state.

SUMMARY OF THE INVENTION

In view of the aforementioned problems of the prior art, one objective of the present invention is to provide a current sensing amplifier and method thereof to cancel the data logic state error reading due to threshold voltage offset and lower data reading speed.

According to the objective, the present invention provides a current sensing amplifier comprising a power input terminal, a first current path, a second current path, a third switch, a fourth switch, a first capacitor, a second capacitor, a latch circuit and latch switch.

The power input terminal is arranged for providing an input voltage. The first current path comprises a first transistor, a first switch and a first load connected in sequential. The first transistor and the first switch are connected to a first node, and the source of the first transistor is connected to the power input terminal. The second current path comprises a second transistor, a second switch and a second load connected in sequential. The second transistor and the second switch are connected in a second node, and the source of the second transistor is connected to the power input terminal. The third switch is connected between the gate of the first transistor and the first node. The fourth switch is connected between the gate of the second transistor and the second node. The first capacitor is connected between the gate of the first transistor and the second node. The second capacitor is connected between the gate of the second transistor and first node. The latch circuit is connected between the first node and the second node. And the latch switch is connected between the latch circuit and a grounding terminal.

When the first switch, the second switch, the third switch and the fourth switch are switched on and the latch switch is switched off, a first current and a second current are respectively injected into the first current path and the second current path to generate a potential difference between the first node and the second node, and the gate of the first transistor and the gate of the second transistor are respectively provided with a first gate voltage and a second gate voltage, and the voltage value of the potential difference is the voltage value difference of the first gate voltage and the second gate voltage.

When the first switch, the second switch, the third switch, the fourth switch and the latch switch are switched off, the first gate voltage and the second gate voltage are coupled to the first transistor and the second transistor according to the first capacitor and the second capacitor respectively, and the potential difference is amplified by the first transistor and the second transistor.

When the first switch, the second switch, the third switch and the fourth switch are switched off and the latch switch is switched on, the voltage of one of the first node and second node is raised up to the input voltage and the voltage of the other is dropped to zero potential by the latch circuit.

According to the objective, the present invention provides a current sensing and amplifying method comprising the following steps. Firstly, provide an input voltage by a power input terminal.

Provide a first current path and a second current path. The first current path comprises a first transistor, a first switch and a first load connected in sequential, the second current path comprising a second transistor, a second switch and a second load connected in sequential. The first transistor and the first switch are connected to a first node and the second transistor and the second switch is connected to a second node.

Connect a third switch between the gate of the transistor and the first node, and connect a fourth switch between the gate of the second transistor and the second node.

Provide a first capacitor connected between the gate of the first transistor and the second node, and provide a fourth capacitor connected between the gate of the second transistor and the first node.

Provide a latch circuit connected between the first node and the second node.

Providing a latch switch connected between the latch circuit and a grounding terminal.

Switch on the first switch, the second switch, the third switch and the fourth switch and switch off the latch switch to inject a first current and a second current into the first current path and the second current path respectively for generating a potential difference between the first node and the second node. The gate of the first transistor and the gate of the second transistor are respectively provided with a first gate voltage and a second gate voltage, and the voltage value of the potential difference is the voltage value difference of the first gate voltage and the second gate voltage.

Couple the first gate voltage and the second gate voltage to the first transistor and the second transistor according to the first capacitor and the second capacitor respectively by switching off the first switch, the second switch, the third switch, the fourth switch and the latch switch. And amplify the potential difference by the first transistor and the second transistor.

Finally, raise the voltage of one of the first node and the second node up to the input voltage and drop the voltage of the other to zero potential according to the latch circuit by switching off the first switch, the second switch, the third switch and the fourth switch and switching on the latch switch.

As described above, the current sensing amplifier and method thereof according the present invention may have the following advantages:

The current sensing amplifier and method thereof may charge the capacitor directly by current to generate the sensing current result independent of threshold voltage. The feedback voltage of the charged capacitor is provided to raise the speed of reading the data logic state.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Exemplary embodiments of the present invention are described herein in the context of an offset cancellation current minor and operating method thereof.

Those of ordinary skilled in the art will realize that the following detailed description of the exemplary embodiment(s) is illustrative only and is not intended to be in any way limiting. Other embodiments will readily suggest themselves to such skilled persons having the benefit of this disclosure. Reference will now be made in detail to implementations of the exemplary embodiment(s) as illustrated in the accompanying drawings. The same reference indicators will be used throughout the drawings and the following detailed description to refer to the same or like parts.

Figure 1:
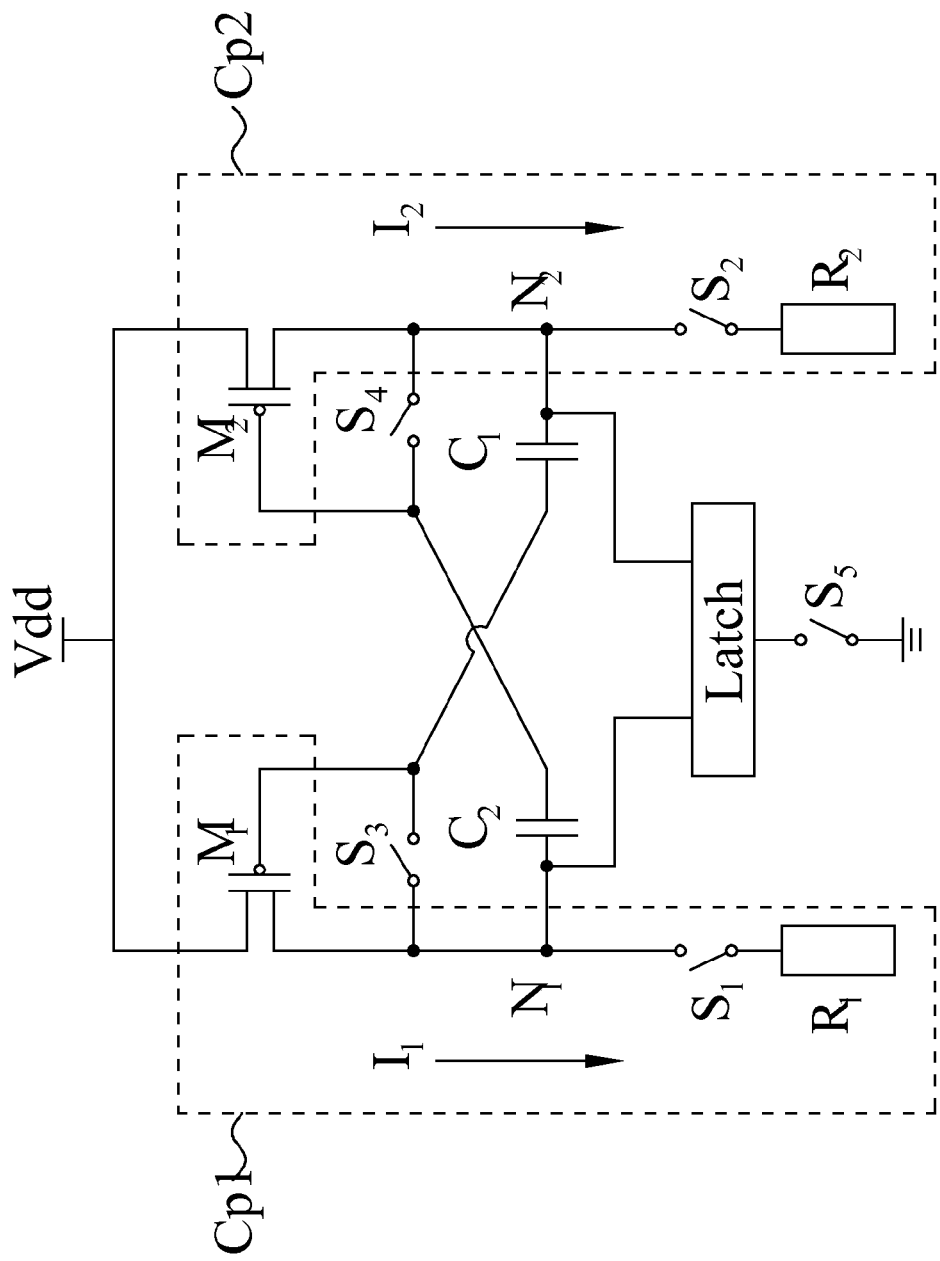
FIG. 1 illustrates a circuit diagram of a first embodiment of a current sensing amplifier in accordance with the present invention.

Referring to FIG. 1, a circuit diagram of a first embodiment of a current sensing amplifier in accordance with the present invention is illustrated. In FIG. 1, the current sensing amplifier comprises a power input terminal Vdd, a first current path Cp1, a second current path Cp2, a first capacitor C1, a second capacitor C2, a third switch S3, a fourth switch S4, a latch circuit Latch and a latch switch S5.

The first current path Cp1 comprises a first transistor M1, a first switch S1 and a first load R1 connected in sequential. The first transistor M1 and the first switch S1 are connected to a first node N1. The source of the first transistor M1 is connected to the power input terminal Vdd to receive an input voltage provided by the power input terminal Vdd. The second current path Cp2 comprising a second transistor M2, a second switch S2 and a second load R2 connected in sequential. The second transistor M2 and the second switch S2 are connected in a second node N2. The source of the second transistor M2 is connected to the power input terminal Vdd to receive an input voltage provided by the power input terminal Vdd. Preferably, the first transistor M1 and the second transistor M2 may be p-type MOSFET, and the first load R1 and the second load R2 are usually the reference memory unit and compared memory unit respectively.

The third switch S3 is connected between the gate of the first transistor M1 and the second node N2. The fourth switch S4 is connected between the gate of the second transistor M2 and the first node N1. The first capacitor C1 is connected between the gate of first transistor M1 and the second node N2. The second capacitor C2 is connected between the gate of the second transistor M2 and the first node N1. The latch circuit Latch is connected between the first node N1 and the second node N2, and the latch switch S5 is connect between the latch circuit Latch and a grounding terminal.

The current sensing amplifier may be operated in three phase. In the first phase, the first switch S1, second switch S2, third switch S3 and four switch are switched on at the same time and the latch switch S5 is switched off. And a first current I1 and a second I2 are respectively injected into the first current path Cp1 and the second current path Cp2. The current value of the first current I1 and the second current I2 are determined by the impedance value of the first load R1 and the second load R2. The primary objective of the present invention is to compare the current value of the first current I1 and the second current I2. When the first current I1 and second current I2 are injected into the first current path Cp1 and second current path Cp2 respectively, the first capacitor C1 and the second capacitor may respectively sample the first current I1 and second current I2 and store the gate voltage of the first transistor M1 (first gate voltage) and the gate voltage of the second transistor M2 (second gate voltage). For the different impedance value of the first load R1 and second load R2, the current value of the first current I1 and the second current I2 are different also. And the voltage value of the first gate voltage and the second gate voltage are different. Therefore, a voltage difference between the first node N1 and the second node N2 may be generated by the first current I1 and second current I2. The voltage of the voltage difference is the voltage value difference of the first gate voltage and the second gate voltage. It is worthy of note that the first and second gate voltage are depend on the threshold voltage of transistors.

In the second phase, the first switch S1, second switch S2, third switch S3, fourth switch S4 and the latch switch S5 are switched off at the same time to cut the current path to first load R1 or second load R2. And the current (I1, I2) may still flow to other electric devices (no shown in the figure) via the first node N1 or second node N2. When the on state of the switches (S1, S2, S3, S4) are changed to off state, the currents flowing through the first transistor M1 and second transistor M2 respectively are still the first current I1 and second current I2 because of the first gate voltage and second gate voltage respectively stored in the first capacitor C1 and the second capacitor C2. Taking an example with the case when second current I2 is larger than the first current I1, the voltage value of the second node N2 is larger than the voltage value of the first node. Thus the voltage on the second node N2 is coupled to the gate of the first transistor M1. And the gate voltage of the first transistor M1 is raised up. And the current flowing through the first transistor is continuing decreased because of the first transistor M1 is p-type MOSFET until being cut off. Hence, the voltage difference value of the first node N1 and the second node N2 is raised up. Please note that the raised voltage difference value is independent of the threshold voltage of the first transistor M1 and second transistor M2.

In the third phase, the first switch S1, second switch S2, third switch S3 and the fourth switch S4 are switched off, but the latch switch S5 is switched on to launch the latch circuit Latch. And the voltage of one node with higher voltage value is raised up until input voltage by the latch circuit Latch. The voltage of the other node with lower voltage value is dropped to zero potential. This is the so-called rail-to-rail state of the latch circuit Latch to maintain the output swing of the latch circuit Latch the same as the input voltage. In this way, the comparing result independent of transistor threshold voltage is generated according to the voltage on the first node N1 or the second node N2.

Because the line-width smaller than 100 nm are usually used in the presently memory manufacturing, the current value of the first current I1 and second current I2 are very small. Thus the first transistor M1 and the second transistor M2 may be operated in sub-threshold region.

Figure 2:
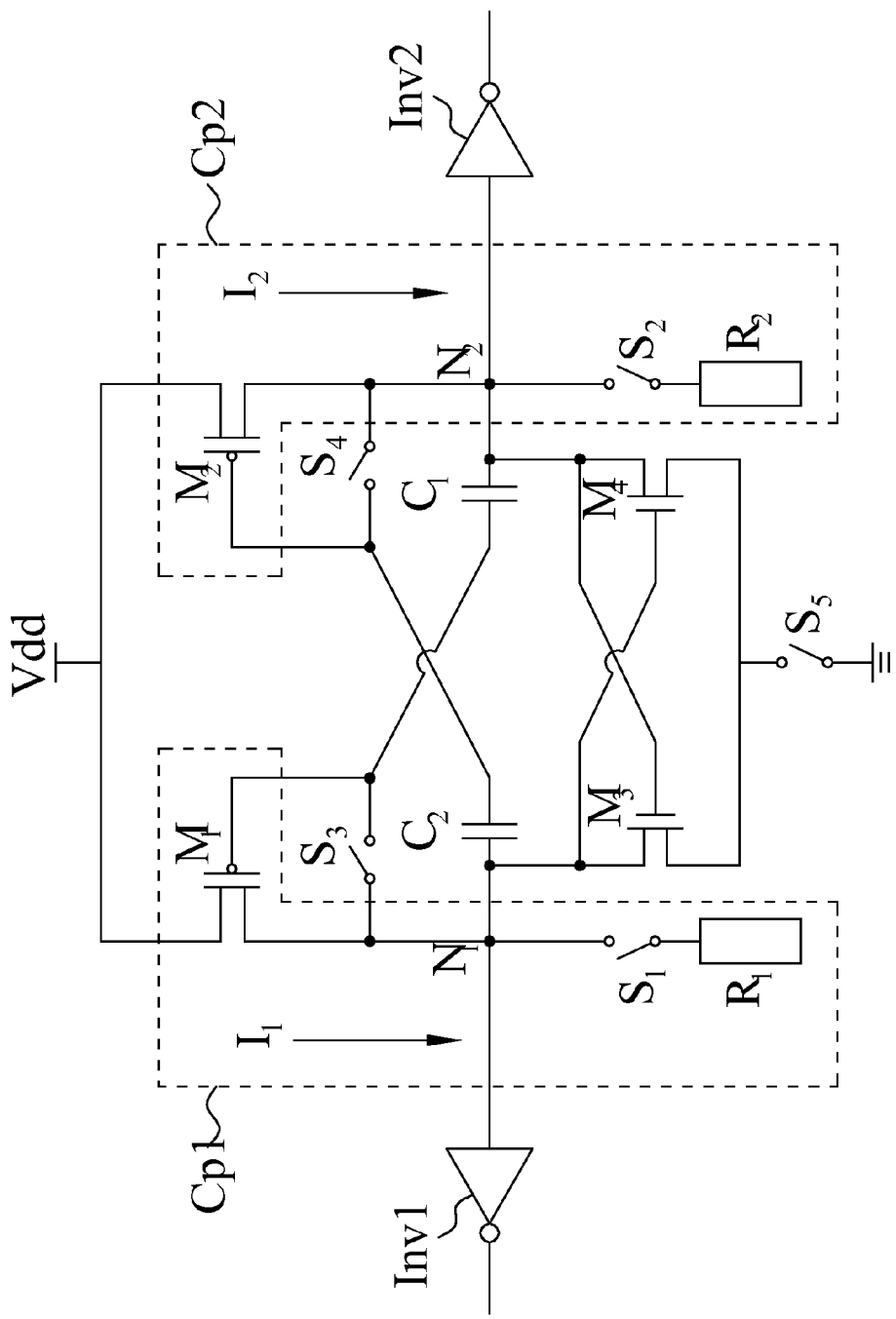
FIG. 2 illustrates a circuit diagram of a second embodiment of a current sensing amplifier in accordance with the present invention.

Referring to FIG. 2, a circuit diagram of a second embodiment of a current sensing amplifier in accordance with the present invention is illustrated. Comparing with the first and second embodiment, the difference is latch circuit Latch in the second embodiment is composed of a third transistor M3 and a fourth transistor M4, and the first node N1 and second node N2 further connecting to a first inverter and a second inverter respectively to output the current comparing result. The other elements are all the same and no longer to be described.

Preferablely, the third transistor M3 and fourth transistor M4 are MOSFET. The drain of the third transistor M3 and the gate of the fourth transistor are respectively connected to the first node N1. The drain of the fourth transistor M4 and the gate of the third transistor M3 are respectively connected to the latch switch S5. The latch switch S5 may be n-type MOSFET and the gate of the latch switch S5 may be switched on or off by applying high or low voltage to the gate thereto.

Attention please, although the threshold voltage of the third transistor M3 and the fourth transistor M4 may have distinct difference due to the manufacturing factor, the voltage difference between the first node N1 and the second node N2 is raised up already. Thus the raised voltage difference is large enough to overcome the threshold voltage mismatch to raise up the voltage of one node to input voltage and drop the voltage of the other to zero potential. Finally, the current comparing result may be outputted from the output terminal of the first inverter Inv1 or the second inverter Inv2.

It is worthy to note that the current sensing amplifier of the present invention is designed in symmetry. And the current sensing amplifier of the present invention may have the excellent ability of preventing varying voltage, noise or temperature during the manufacturing process.

Figure 3:
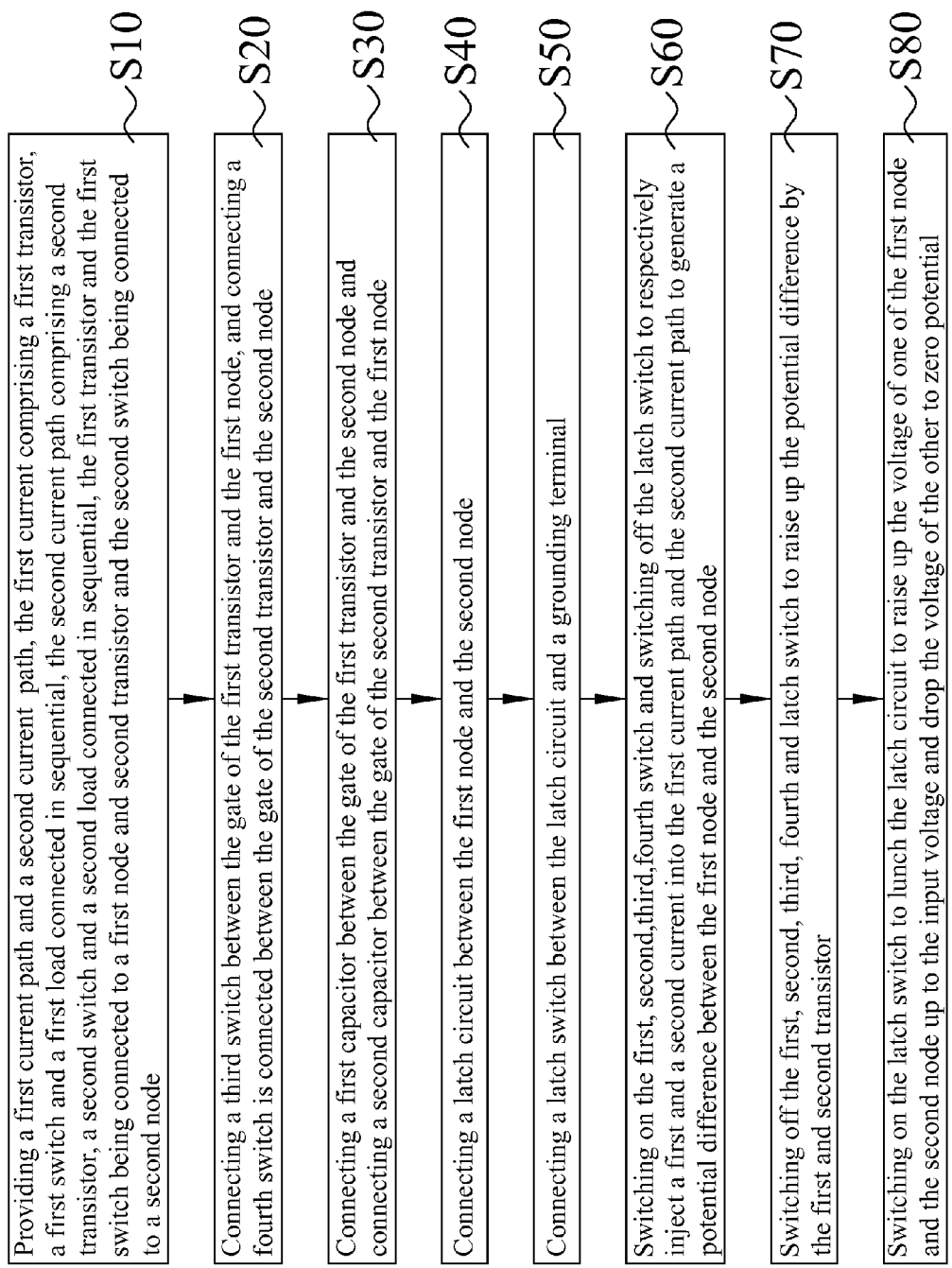
FIG. 3 illustrates a block chart of a current sensing and amplifying method in accordance with the present invention.

Referring to FIG. 3, a block chart of a current sensing and amplifying method in accordance with the present invention is illustrated. The current sensing and amplifying method comprises the step of:

In step S10, an input voltage is provided by a power input terminal.

In step S20, a first current path and a second current path are provided. The first current path and a second current path, the first current path comprises a first transistor, a first switch and a first load connected in sequential. The second current path comprises a second transistor, a second switch and a second load connected in sequential. The first transistor and the first switch are connected to a first node and the second transistor and the second switch is connected to a second node.

In step S30, a third switch is connected between the gate of the first transistor and the first node. And a fourth switch is connected between the gate of the second transistor and the second node.

In the step S40, a first capacitor is connected between the gate of the first transistor and the second node. And a second capacitor is connected between the gate of the second transistor and the first node.

In the step S50, a latch circuit is connected between the first node and the second node.

In the step S60, a latch switch is connected between the latch circuit and a grounding terminal.

In the step S70, the first, second, third switch are switched on and the latch switch is switched off. And a first and a second current are injected into the first current path and the second current path respectively to generate a potential difference between the first node and the second node In the step S80, the first, second, third, fourth and latch switch are switched off to raise up the potential difference by the first and second transistor.

In the step S90, the latch switch is switched on to lunch the latch circuit to raise up the voltage of one of the first node and the second node up to the input voltage and drop the voltage of the other to zero potential.

While particular embodiments of the present invention have been shown and described, it will be obvious to those skilled in the art that, based upon the teachings herein, changes and modifications may be made without departing from this invention and its broader aspects. Therefore, the appended claims are intended to encompass within their scope of all such changes and modifications as are within the true spirit and scope of the exemplary embodiment(s) of the present invention.

What is claimed is:

1. A current sensing amplifier comprising:
   a power input terminal being arranged for providing an input voltage;
   a first current path comprising a first transistor, a first switch and a first load connected in sequential, the first transistor and the first switch being connected to a first node, and the source of the first transistor being connected to the power input terminal;
   a second current path comprising a second transistor, a second switch and a second load connected in sequential, the second transistor and the second switch being connected in a second node, and the source of the second transistor being connected to the power input terminal;
   a third switch being connected between the gate of the first transistor and the first node;
   a fourth switch being connected between the gate of the second transistor and the second node;
   a first capacitor being connected between the gate of the first transistor and the second node;
   a second capacitor being connected between the gate of the second transistor and first node;
   a latch circuit being connected between the first node and the second node; and
   a latch switch being connected between the latch circuit and a grounding terminal.

2. The current sensing amplifier of claim 1, wherein, when the first switch, the second switch, the third switch and the fourth switch are switched on and the latch switch is switched off, a first current and a second current are respectively injected into the first current path and the second current path to generate a potential difference between the first node and the second node, and the gate of the first transistor and the gate of the second transistor are respectively provided with a first gate voltage and a second gate voltage, and the voltage value of the potential difference is the voltage value difference of the first gate voltage and the second gate voltage.

3. The current sensing amplifier of claim 2, wherein, when the first switch, the second switch, the third switch, the fourth switch and the latch switch are switched off, the first gate voltage and the second gate voltage are coupled to the first transistor and the second transistor according to the first capacitor and the second capacitor respectively, and the potential difference is amplified by the first transistor and the second transistor.

4. The current sensing amplifier of claim 3, wherein, when the first switch, the second switch, the third switch and the fourth switch are switched off and the latch switch is switched on, the voltage of one of the first node and second node is raised up to the input voltage and the voltage of the other is dropped to zero potential by the latch circuit.

5. The current sensing amplifier of claim 1, wherein the latch circuit comprises a third transistor and a fourth transistor, the drain of the third transistor and the gate of the fourth transistor are respectively connected to the first node, the drain of the fourth transistor and the gate of the third transistor are respectively connected to the second node, and the source of the third transistor and the source of the fourth transistor are connected to the latch switch.

6. The current sensing amplifier of claim 5, wherein the third switch and the fourth switch are MOSFET.

7. The current sensing amplifier of claim 1, wherein the first transistor and the second transistor are p type MOSFET and the first transistor and the second transistor are operated in sub-threshold region.

8. A current sensing and amplifying method, comprising the steps of:
providing an input voltage by a power input terminal;
providing a first current path and a second current path, the first current path comprising a first transistor, a first switch and a first load connected in sequential, the second current path comprising a second transistor, a second switch and a second load connected in sequential, the first transistor and the first switch being connected to a first node and the second transistor and the second switch being connected to a second node;
connecting a third switch between the gate of the transistor and the first node, and connecting a fourth switch between the gate of the second transistor and the second node;
providing a first capacitor connected between the gate of the first transistor and the second node, and providing a fourth capacitor connected between the gate of the second transistor and the first node;
providing a latch circuit connected between the first node and the second node;
providing a latch switch connected between the latch circuit and a grounding terminal;
switching on the first switch, the second switch, the third switch and the fourth switch and switching off the latch switch to inject a first current and a second current into the first current path and the second current path respectively for generating a potential difference between the first node and the second node, the gate of the first transistor and the gate of the second transistor being respectively provided with a first gate voltage and a second gate voltage, and the voltage value of the potential difference being the voltage value difference of the first gate voltage and the second gate voltage;
coupling the first gate voltage and the second gate voltage to the first transistor and the second transistor according to the first capacitor and the second capacitor respectively by switching off the first switch, the second switch, the third switch, the fourth switch and the latch switch, and amplifying the potential difference by the first transistor and the second transistor; and
raising the voltage of one of the first node and the second node up to the input voltage and dropping the voltage of the other to zero potential according to the latch circuit by switching off the first switch, the second switch, the third switch and the fourth switch and switching on the latch switch.

9. The current sensing and amplifying method of claim 8, wherein the latch circuit comprises a third transistor and a fourth transistor, the drain of the third transistor and the gate of the fourth transistor are respectively connected to the first node, the drain of the fourth transistor and the gate of the third transistor are respectively connected to the second node, and the source of the third transistor and the source of the fourth transistor are connected to the latch switch.

10. The current sensing and amplifying method of claim 9, wherein the third switch and the fourth switch are MOSFET.

11. The current sensing and amplifying method of claim 8, wherein the first transistor and the second transistor are p type MOSFET and the first transistor and the second transistor are operated in sub-threshold region.

12. The current sensing and amplifying method of claim 8, further comprising the step of connecting a first inverter and a second inverter to the first node and the second node respectively to output a current comparing result according to the voltage of the first node or the voltage of the second node.

\* \* \* \* \*